United States Patent
Goto et al.

(10) Patent No.: US 10,947,641 B2
(45) Date of Patent: Mar. 16, 2021

(54) GROUP III NITRIDE SEMICONDUCTOR SUBSTRATE AND METHOD OF MANUFACTURING GROUP III NITRIDE SEMICONDUCTOR SUBSTRATE

(71) Applicant: FURUKAWA CO., LTD., Tokyo (JP)

(72) Inventors: Hiroki Goto, Tochigi (JP); Yujiro Ishihara, Tochigi (JP)

(73) Assignee: FURUKAWA CO., LTD., Tokyo (JP)

( * ) Notice: Subject to any disclaimer, the term of this patent is extended or adjusted under 35 U.S.C. 154(b) by 0 days.

(21) Appl. No.: 16/497,842

(22) PCT Filed: Mar. 19, 2018

(86) PCT No.: PCT/JP2018/010716
§ 371 (c)(1),
(2) Date: Sep. 26, 2019

(87) PCT Pub. No.: WO2018/180672
PCT Pub. Date: Oct. 4, 2018

(65) Prior Publication Data
US 2020/0032418 A1    Jan. 30, 2020

(30) Foreign Application Priority Data
Mar. 29, 2017 (JP) .............................. JP2017-064486

(51) Int. Cl.
C30B 29/40 (2006.01)
C23C 16/02 (2006.01)
(Continued)

(52) U.S. Cl.
CPC ........ C30B 29/406 (2013.01); C23C 16/0209 (2013.01); C23C 16/303 (2013.01);
(Continued)

(58) Field of Classification Search
CPC .... C30B 29/406; C30B 29/68; H01L 29/2003
(Continued)

(56) References Cited

U.S. PATENT DOCUMENTS 9,214,336 B2   12/2015   Nakada
9,627,581 B2   4/2017    Choe
(Continued)

FOREIGN PATENT DOCUMENTS

CN    103700579 A    4/2014
EP    3597797 A1     1/2020
(Continued)

OTHER PUBLICATIONS

International Search Report dated Jun. 19, 2018 filed in PCT/JP2018/010716.
(Continued)

*Primary Examiner* — Humera N. Sheikh
*Assistant Examiner* — Katherine A Christy
(74) *Attorney, Agent, or Firm* — Rankin, Hill & Clark LLP (57) ABSTRACT

There is provided a group III nitride semiconductor substrate (free-standing substrate (30)) that is formed of a group III nitride semiconductor crystal and has a thickness of 300 μm or more and 1000 μm or less. Both exposed first and second main surfaces in a relationship of top and bottom are semipolar planes. A difference in a half width of an X-ray rocking curve (XRC) measured by making X-rays incident on each of the first and second main surfaces in parallel to an m axis of the group III nitride semiconductor crystal is 500 arcsec or less.

9 Claims, 5 Drawing Sheets

(51) Int. Cl.
*C23C 16/30* (2006.01)
*C30B 25/18* (2006.01)
*C30B 29/68* (2006.01)
*H01L 29/20* (2006.01)

(52) U.S. Cl.
CPC .......... *C30B 25/183* (2013.01); *C30B 25/186* (2013.01); *C30B 29/68* (2013.01); *H01L 29/2003* (2013.01)

(58) Field of Classification Search
USPC ........................................................ 428/698
See application file for complete search history.

(56) References Cited

U.S. PATENT DOCUMENTS

| | | |
|---|---|---|
| 9,978,589 B2 | 5/2018 | Han |
| 10,301,743 B2 | 5/2019 | Fujisawa et al. |
| 2007/0012943 A1 | 1/2007 | Okahisa et al. |
| 2014/0087545 A1 | 3/2014 | Nakada |
| 2015/0357521 A1 | 12/2015 | Choe |
| 2017/0047220 A1 | 2/2017 | Han |
| 2017/0327971 A1* | 11/2017 | Fujisawa ............... C30B 29/406 |
| 2019/0127881 A1 | 5/2019 | Fujisawa et al. |
| 2020/0132750 A1 | 4/2020 | Goto et al. |

FOREIGN PATENT DOCUMENTS

| | | |
|---|---|---|
| JP | 2014196230 A | 10/2014 |
| JP | 201612717 A | 1/2016 |
| JP | 2017030984 A | 2/2017 |
| WO | 2015160903 A1 | 10/2015 |
| WO | 2016125890 A1 | 8/2016 |

OTHER PUBLICATIONS

Extended European Search Report (EESR) dated Nov. 23, 2020 issued in the corresponding European Patent Application No. 18776229.9.

Chinese Office Action (CNOA) dated Dec. 16, 2020 issued in the corresponding Chinese patent application No. 201880021145.6.

* cited by examiner

FIG. 10

GROUP III NITRIDE SEMICONDUCTOR SUBSTRATE AND METHOD OF MANUFACTURING GROUP III NITRIDE SEMICONDUCTOR SUBSTRATE

TECHNICAL FIELD

The present invention relates to a group III nitride semiconductor substrate and a method of manufacturing a group III nitride semiconductor substrate.

BACKGROUND ART

A substrate including a group III nitride semiconductor layer having a semipolar plane as a main surface has been developed. A related technique is disclosed in Patent Document 1.

Patent Document 1 discloses a substrate having a layer which is formed of a group III nitride semiconductor and in which the normal of the main surface is inclined in the range of 5° or more and 17° or less in the +c axis direction from the [11-22] axis.

As a manufacturing method therefor, a method of forming a layer, such as that described above, by epitaxially growing a group III nitride semiconductor over a base substrate (a sapphire substrate, a group III nitride semiconductor substrate, or the like) whose main surface has a predetermined plane orientation, with a semipolar plane having a Ga polar component as a growth plane, using a metal organic chemical vapor deposition (MOCVD) method, a molecular beam epitaxy method, a hydride vapor phase epitaxy (HVPE) method, or the like is disclosed.

RELATED DOCUMENT

Patent Document

[Patent Document 1] Japanese Unexamined Patent Publication No. 2016-12717

SUMMARY OF THE INVENTION

Technical Problem

In growth using a semipolar plane having a Ga polar component as a growth plane as in the technique disclosed in Patent Document 1, the half width of the X-ray rocking curve (XRC), which is one of the indices of crystallinity evaluation, becomes worse as the thickness of the growth increases (specifically, 1 mm or more). For this reason, it has been difficult to obtain a bulk crystal with excellent crystallinity.

It is an object of the present invention to provide a new technique for growing a group III nitride semiconductor having a semipolar plane as a main surface.

Solution to Problem

According to the present invention, there is provided a group III nitride semiconductor substrate that is formed of a group III nitride semiconductor crystal and has a thickness of 300 μm or more and 1000 μm or less. Both exposed first and second main surfaces in a relationship of top and bottom are semipolar planes. A difference between half widths of an X-ray rocking curve (XRC) measured by making X-rays incident on each of the first and second main surfaces in parallel to an m axis of the group III nitride semiconductor crystal is 500 arcsec or less.

In addition, according to the present invention, there is provided a method of manufacturing a group III nitride semiconductor substrate including: a substrate preparation step of preparing a sapphire substrate; a heat treatment step of performing heat treatment on the sapphire substrate after the substrate preparation step; a pre-flow step of supplying a metal-containing gas onto the sapphire substrate after the heat treatment step; a buffer layer forming step of forming a buffer layer over the sapphire substrate under growth conditions of a growth temperature of 800° C. or higher and 950° C. or lower and a pressure of 30 torr or higher and 200 torr or lower after the pre-flow step; a first growth step of forming a first growth layer by growing a group III nitride semiconductor over the buffer layer under growth conditions of a growth temperature of 800° C. or higher and 1025° C. or lower, a pressure of 30 torr or higher and 200 torr or lower, and a growth rate of 10 μm/h or higher using an MOCVD method after the buffer layer forming step; and a second growth step of forming a second growth layer by growing a group III nitride semiconductor over the first growth layer using an HVPE method after the first growth step.

Advantageous Effects of Invention

According to the present invention, a new technique for growing a group III nitride semiconductor having a semipolar plane as a main surface is realized.

BRIEF DESCRIPTION OF THE DRAWINGS

The objects described above, other objects, characteristics, and advantages will be made clearer from preferred embodiments described below and the following accompanying drawings.

DESCRIPTION OF EMBODIMENTS

Hereinafter, embodiments of a group III nitride semiconductor substrate and a method of manufacturing a group III nitride semiconductor substrate of the present embodiment will be described with reference to the diagrams. The diagrams are merely schematic diagrams for illustrating the configuration of the invention, and the sizes, shapes, and numbers of respective members, the ratios of the sizes of different members, and the like are not limited to those illustrated.

First, the outline of the present embodiment will be described. According to the method of manufacturing a group III nitride semiconductor substrate of the present embodiment including plural characteristic steps, it is possible to grow a group III nitride semiconductor over a sapphire substrate with a semipolar plane (semipolar plane which is represented by Miller index (hkml) and in which 1 is less than 0) on the N polarity side as a growth plane using the MOCVD method. As a result, a template substrate in which a group III nitride semiconductor layer whose exposed surface is a semipolar plane on the N polarity side is located over a sapphire substrate or a free-standing substrate of group III nitride semiconductor obtained by removing a sapphire substrate from the template substrate is obtained.

Then, according to the method of manufacturing a group III nitride semiconductor substrate of the present embodiment, thick film growth of the group III nitride semiconductor can be performed over the template substrate or the free-standing substrate with the semipolar plane on the N polarity side as a growth plane using the HVPE method. As a result, a bulk crystal of a group III nitride semiconductor whose exposed surface is a semipolar plane on the N polarity side is obtained.

Although the details will be described below, according to the manufacturing method, in a case where the group III nitride semiconductor is grown to a thick film, the half width of the XRC, which is one of the indices of crystallinity evaluation, tends to hardly change or become better as the thickness of the growth increases. For this reason, a bulk crystal with excellent crystallinity can be obtained. Then, by slicing or the like of the bulk crystal, a large number of free-standing substrates of group III nitride semiconductor can be obtained.

Figure 1:
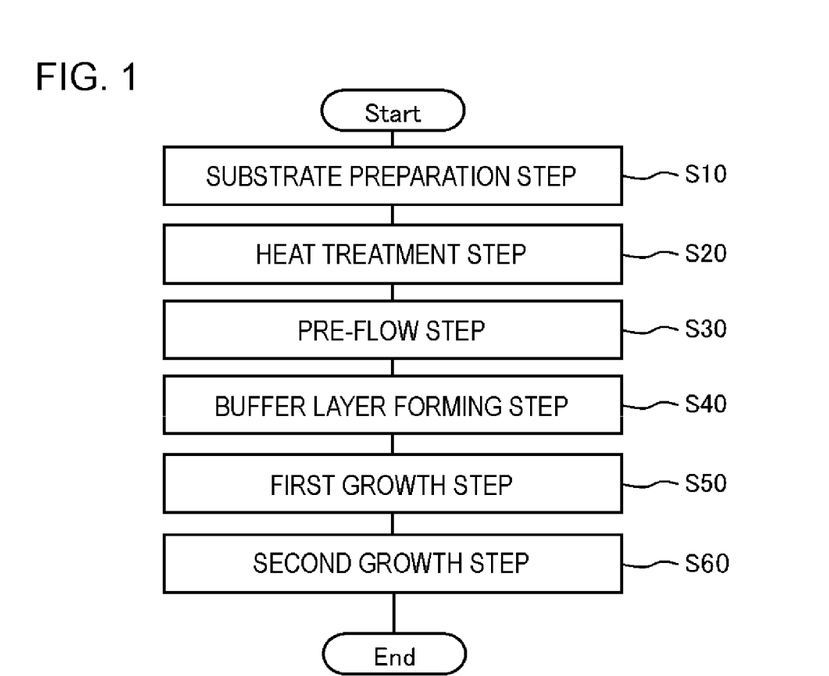
FIG. 1 is a flowchart showing an example of the flow of the process of a method of manufacturing a group III nitride semiconductor substrate of the present embodiment.

Next, the present embodiment will be described in detail. FIG. 1 shows an example of the flow of the process of the method of manufacturing a group III nitride semiconductor substrate of the present embodiment. As shown in the diagram, a substrate preparation step S10, a heat treatment step S20, a pre-flow step S30, a buffer layer forming step S40, a first growth step S50, and a second growth step S60 are included. Although not shown, a cutting step may be included after the second growth step S60.

In the substrate preparation step S10, a sapphire substrate is prepared. The diameter of the sapphire substrate is, for example, 1 inch or more. In addition, the thickness of the sapphire substrate is, for example, 250 μm or more.

The plane orientation of the main surface of the sapphire substrate is one of plural factors for controlling the plane orientation of the growth plane of the group III nitride semiconductor layer epitaxially grown thereover. The relationship between the factor and the plane orientation of the growth plane of the group III nitride semiconductor layer is shown in the following example. In the substrate preparation step S10, a sapphire substrate whose main surface has a desired plane orientation is prepared.

The main surface of the sapphire substrate is, for example, a {10-10} plane or a plane obtained by making the {10-10} plane inclined by a predetermined angle in a predetermined direction.

The plane obtained by making the {10-10} plane inclined by a predetermined angle in a predetermined direction may be, for example, a plane obtained by making the {10-10} plane inclined by any angle greater than 0° and equal to or less than 0.5° in any direction.

In addition, the plane obtained by making the {10-10} plane inclined by a predetermined angle in a predetermined direction may be, for example, a plane obtained by making the {10-10} plane inclined by any angle greater than 0° and less than 10.5° in a direction in which the plane becomes parallel to the a-plane. Alternatively, the plane obtained by making the {10-10} plane inclined by a predetermined angle in a predetermined direction may be, for example, a plane obtained by making the {10-10} plane inclined by any angle greater than 0° and equal to or less than 10.5° in a direction in which the plane becomes parallel to the a-plane. For example, the plane obtained by making the {10-10} plane inclined by a predetermined angle in a predetermined direction may be a plane obtained by making the {10-10} plane inclined by any angle of 0.5° or more and 1.5° or less, 1.5° or more and 2.5° or less, 4.5° or more and 5.5° or less, 6.5° or more and 7.5° or less, and 9.5° or more and 10.5° or less in a direction in which the plane becomes parallel to the a-plane.

The heat treatment step S20 is performed after the substrate preparation step S10. In the heat treatment step S20, heat treatment is performed on the sapphire substrate under the following conditions.

Temperature: 800° C. or higher and 1200° C. or lower
Pressure: 30 torr or higher to 760 torr or lower
Heat treatment time: 5 minutes or more and 20 minutes or less
Carrier gas: $H_2$, or $H_2$ and $N_2$ ($H_2$ ratio of 0 to 100%)
Carrier gas supply rate: 3 slm or more and 50 slm or less (however, since the supply rate changes depending on the size of the growth apparatus, the supply rate is not limited thereto.)

The heat treatment on the sapphire substrate may be performed while performing nitriding treatment, or may be performed without performing nitriding treatment. In a case where the heat treatment is performed while performing the nitriding treatment, $NH_3$ of 0.5 slm or more and 20 slm or less is supplied onto the sapphire substrate during the heat treatment (however, since the supply rate changes depending on the size of the growth apparatus, the supply rate is not limited thereto). In addition, in a case where the heat treatment is performed without performing the nitriding treatment, $NH_3$ is not supplied during the heat treatment.

The presence or absence of the nitriding treatment during the heat treatment may be one of plural factors for controlling the plane orientation of the growth plane of the group III nitride semiconductor layer epitaxially grown over the main surface of the sapphire substrate. The relationship between the factor and the plane orientation of the growth plane of the group III nitride semiconductor layer is shown in the following example.

The pre-flow step S30 is performed after the heat treatment step S20. In the pre-flow step S30, a metal-containing gas is supplied onto the main surface of the sapphire substrate under the following conditions. The pre-flow step S30 may be performed, for example, in an MOCVD apparatus.

Temperature: 500° C. or higher and 1000° C. or lower
Pressure: 30 torr or higher to 200 torr or lower
Trimethylaluminum supply rate, supply time: 20 ccm or more and 500 ccm or less, 1 second or more and 60 seconds or less Carrier gas: $H_2$, or $H_2$ and $N_2$ ($H_2$ ratio of 0 to 100%)

Carrier gas supply rate: 3 slm or more and 50 slm or less (however, since the gas supply rate changes depending on the size or the configuration of the growth apparatus, the gas supply rate is not limited thereto.)

The conditions described above are for a case of supplying trimethylaluminum and triethylaluminum, which are organic metal materials, as the metal-containing gas. In this step, a metal-containing gas containing another metal instead of trimethylaluminum, triethylaluminum may be supplied, and another metal film, such as a titanium film, a vanadium film, or a copper film, may be formed over the main surface of the sapphire substrate instead of the aluminum film. In addition, another metal carbide film, such as aluminum carbide, titanium carbide, vanadium carbide, and copper carbide, which is a reaction film with a hydrocarbon compound such as methane, ethylene, or ethane generated from organic metal raw materials, may be formed over the main surface of the sapphire substrate.

In the pre-flow step S30, a metal film and a metal carbide film are formed over the main surface of the sapphire substrate. The presence of the metal film is a condition for reversing the polarity of the crystal grown thereover. That is, the execution of the pre-flow step S30 is one of plural factors for setting the plane orientation of the growth plane of the group III nitride semiconductor layer epitaxially grown over the main surface of the sapphire substrate to the plane on the N polarity side.

The buffer layer forming step S40 is performed after the pre-flow step S30. In the buffer layer forming step S40, a buffer layer is formed over the main surface of the sapphire substrate. The thickness of the buffer layer is, for example, 20 nm or more and 300 nm or less.

The buffer layer is, for example, an AlN layer. For example, an AlN crystal may be epitaxially grown under the following conditions to form a buffer layer.

Growth method: MOCVD method
Growth temperature: 800° C. or higher and 950° C. or lower
Pressure: 30 torr or higher to 200 torr or lower
Trimethylaluminum supply rate: 20 ccm or more and 500 ccm or less
$NH_3$ supply rate: 0.5 slm or more and 10 slm or less
Carrier gas: $H_2$, or $H_2$ and $N_2$ ($H_2$ ratio of 0 to 100%)
Carrier gas supply rate: 3 slm or more and 50 slm or less (however, since the gas supply rate changes depending on the size or the configuration of the growth apparatus, the gas supply rate is not limited thereto.)

The growth conditions for the buffer layer forming step S40 may be one of plural factors for controlling the plane orientation of the growth plane of the group III nitride semiconductor layer epitaxially grown over the main surface of the sapphire substrate. The relationship between the factor and the plane orientation of the growth plane of the group III nitride semiconductor layer is shown in the following example.

In addition, the growth conditions (relatively low predetermined growth temperature, specifically, 800 to 950° C., and relatively low pressure) in the buffer layer forming step S40 are conditions for growing AlN while maintaining the N polarity. That is, the growth conditions in the buffer layer forming step S40 are one of plural factors for setting the plane orientation of the growth plane of the group III nitride semiconductor layer epitaxially grown over the main surface of the sapphire substrate to the plane on the N polarity side.

The first growth step S50 is performed after the buffer layer forming step S40. In the first growth step S50, a group III nitride semiconductor crystal (for example, GaN crystal) is epitaxially grown over the buffer layer under the following growth conditions, thereby forming a group III nitride semiconductor layer (first growth layer) whose growth plane has a predetermined plane orientation (semipolar plane on the N polarity side). The thickness of the first growth layer is, for example, 1 μm or more and 20 μm or less.

Growth method: MOCVD method
Growth temperature: 800° C. or higher to 1025° C. or lower
Pressure: 30 torr or higher to 200 torr or lower
TMGa supply rate: 25 sccm or more and 1000 sccm or less
$NH_3$ supply rate: 1 slm or more and 20 slm or less
Carrier gas: $H_2$, or $H_2$ and $N_2$ ($H_2$ ratio of 0 to 100%)
Carrier gas supply rate: 3 slm or more and 50 slm or less (however, since the gas supply rate changes depending on the size or the configuration of the growth apparatus, the gas supply rate is not limited thereto.)
Growth rate: 10 μm/h or higher The growth conditions (relatively low growth temperature, relatively low pressure, and relatively fast growth rate) in the first growth step S50 are conditions for growing GaN while maintaining the N polarity. That is, the growth conditions in the first growth step S50 are one of plural factors for setting the plane orientation of the growth plane of the group III nitride semiconductor layer epitaxially grown over the main surface of the sapphire substrate to the plane on the N polarity side.

Figure 2:
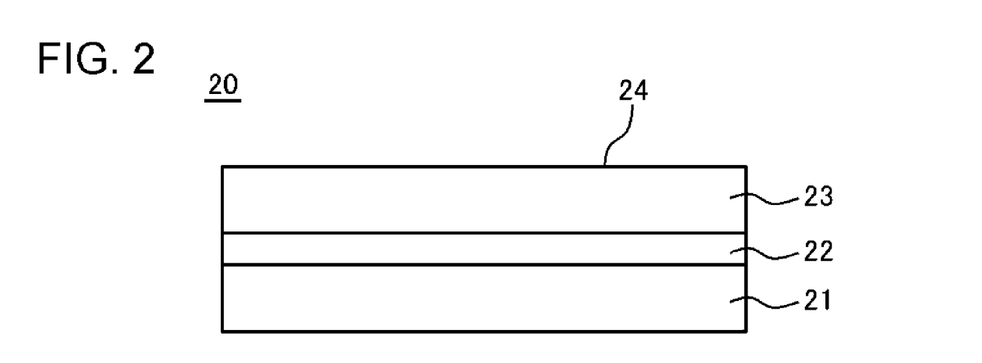
FIG. 2 is a side view schematically showing an example of a template substrate 20 of the present embodiment.

As described above, it is possible to manufacture a template substrate 20 as shown in FIG. 2 in which a sapphire substrate 21, a buffer layer 22, and a group III nitride semiconductor layer (first growth layer 23) are laminated in this order and the plane orientation of a growth plane 24 of the first growth layer 23 is a semipolar plane on the N polarity side. In addition, by adjusting the manufacturing conditions in the range of the above conditions, it is possible to set the plane orientation of the growth plane 24 to a desired semipolar plane.

Figure 3:
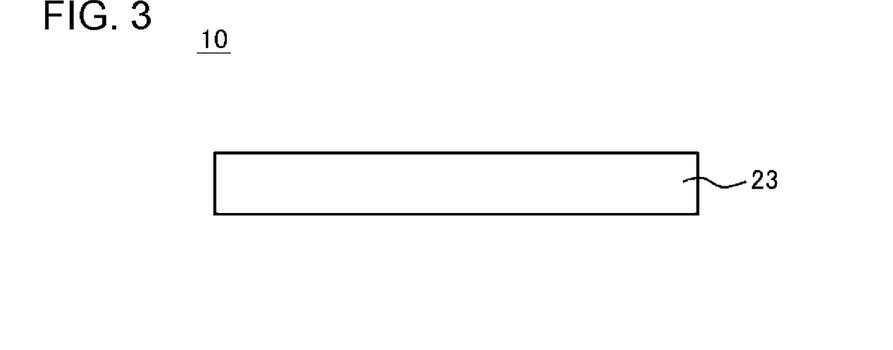
FIG. 3 is a side view schematically showing an example of a free-standing substrate 10 of the present embodiment.

In addition, by removing the sapphire substrate 21 and the buffer layer 22 after obtaining the laminate as shown in FIG. 2 in which the sapphire substrate 21, the buffer layer 22, and the group III nitride semiconductor layer (first growth layer) 23 are laminated in this order, it is possible to manufacture the free-standing substrate 10 formed of the first growth layer 23 as shown in FIG. 3.

A means that removes the sapphire substrate 21 and the buffer layer 22 is not particularly limited. For example, the sapphire substrate 21 and the first growth layer 23 may be separated from each other using stress caused by the difference in linear expansion coefficient between the sapphire substrate 21 and the first growth layer 23. Then, the buffer layer 22 may be removed by polishing, etching, or the like.

As another example of removal, a peeling layer may be formed between the sapphire substrate 21 and the buffer layer 22. For example, as a peeling layer, a layer may be formed by forming a laminate of a carbon layer in which carbide (aluminum carbide, titanium carbide, zirconium carbide, hafnium carbide, vanadium carbide, or tantalum carbide) is dispersed and a layer of carbide (aluminum carbide, titanium carbide, zirconium carbide, hafnium carbide, vanadium carbide, or tantalum carbide) over the sapphire substrate 21, and then subjecting the laminate to nitriding treatment.

In a case where the buffer layer 22 and the first growth layer 23 are formed over such a peeling layer and then the laminate is heated at a temperature higher than the heating temperature at the time of forming the first growth layer 23, it is possible to perform separation into a portion on the sapphire substrate 21 side and a portion on the first growth layer 23 side with a portion of the peeling layer as a boundary. By removing the buffer layer 22 and the like from the portion on the first growth layer 23 side by polishing, etching, or the like, it is possible to obtain the free-standing substrate 10 formed of the first growth layer 23 as shown in FIG. 3.

The second growth step S60 is performed after the first growth step S50. In the second growth step S60, a group III nitride semiconductor crystal (for example, GaN crystal) is epitaxially grown over the first growth layer 23 of the template substrate 20 (refer to FIG. 2) or over the main surface (semipolar plane on the N polarity side) of the first growth layer 23 of the free-standing substrate 10 (refer to FIG. 3) under the following growth conditions, thereby forming a group III nitride semiconductor layer (second growth layer) whose growth plane has a predetermined plane orientation (semipolar plane on the N polarity side). The thickness of the second growth layer is, for example, 1.0 mm or more.

Growth method: HVPE method
Growth temperature: 900° C. or higher to 1100° C. or lower
Growth time: 1 hour or longer
V/III ratio: 1 or more and 20 or less
Growth film thickness: 1.0 mm or more The second growth step S60 may not be performed continuously but may be divided into plural steps. For example, after growing up to a predetermined film thickness by the HVPE method, cooling may be once performed and then growing up to a predetermined film thickness by the HVPE method may be performed again. After forming the group III nitride semiconductor layer in the first step, once the group III nitride semiconductor layer is cooled, a crack is generated in the group III nitride semiconductor layer. As a result, internal stress is reduced. Thereafter, in a case where the group III nitride semiconductor is epitaxially grown over the group III nitride semiconductor layer having a crack, as the group III nitride semiconductor grows, crystals separated from each other with the crack interposed therebetween meet each other. Then, since internal stress is reduced by the above-described cooling, cracking does not easily occur in the bulk crystal even if the film is thickened.

The second growth step S60 may be performed in a state in which the template substrate 20 or the free-standing substrate 10 is fixed to a susceptor, such as a carbon susceptor. In this manner, deformation of the template substrate 20 or the free-standing substrate 10 due to the heating in the second growth step S60 can be suppressed. In addition, although a method using an alumina-based adhesive and the like are exemplified as fixing methods, the fixing method is not limited thereto. By these characteristic methods, a large-diameter bulk crystal having a maximum diameter of 50 mm or more and 4 inches or less is achieved.

Figure 4:
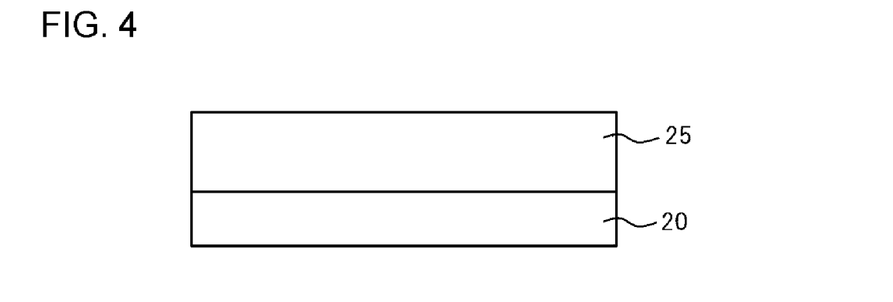
FIG. 4 is a side view schematically showing an example of a structure obtained by the method of manufacturing a group III nitride semiconductor substrate of the present embodiment.
Figure 5:
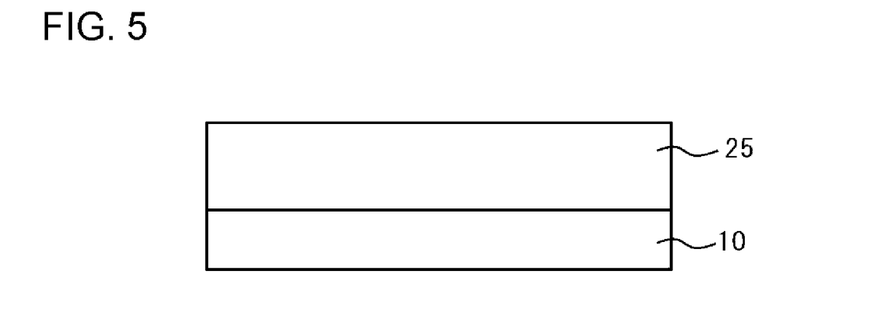
FIG. 5 is a side view schematically showing an example of a structure obtained by the method of manufacturing a group III nitride semiconductor substrate of the present embodiment.

From the above, a laminate (refer to FIG. 4) having the template substrate 20 and a second growth layer 25 or a laminate (refer to FIG. 5) having the free-standing substrate 10 and the second growth layer 25 is obtained.

In the cutting step performed after the second growth step S60, a free-standing substrate 30 (refer to FIG. 6) formed of a group III nitride semiconductor layer is obtained by cutting the group III nitride semiconductor layer from the bulk crystal including the first growth layer 23 and the second growth layer 25 by slicing or the like. The group III nitride semiconductor layer cut by slicing or the like may be formed of only the second growth layer 25, may include the first growth layer 23 and the second growth layer 25, or may be formed of only the first growth layer 23.

However, it is preferable that the group III nitride semiconductor layer cut by slicing or the like is a portion having a growth thickness (thickness counted with the growth start point of the first growth layer 23 as 0) of 3 mm or more within the bulk crystal including the first growth layer 23 and the second growth layer 25. The reason is that the dislocation defect density within the crystal is approximately $1 \times 10^7$ cm$^{-2}$ or less to obtain the quality suitable for a substrate for a device.

Figure 6:
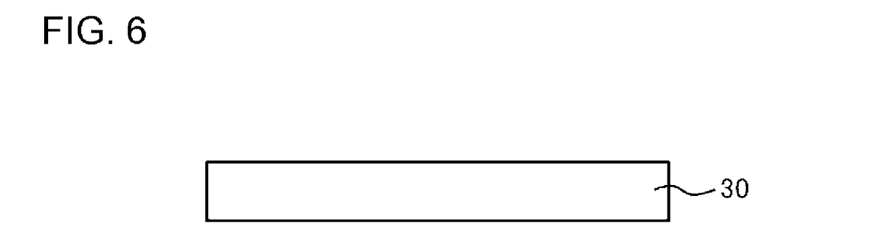
FIG. 6 is a side view schematically showing an example of a free-standing substrate 30 of the present embodiment.

Next, the configuration and features of the free-standing substrate 30 obtained by the above manufacturing method will be described.

According to the manufacturing method of the present embodiment in which the group III nitride semiconductor is grown to a thick film with the semipolar plane on the N polarity side as a growth plane, the half width of the XRC, which is one of the indices of crystallinity evaluation, tends to hardly change or become gradually better as the thickness of the growth increases. The features due to the tendency appear in the free-standing substrate 30 of the present embodiment. The tendency is different from a tendency in a case where the group III nitride semiconductor is grown to a thick film with the semipolar plane (semipolar plane which is represented by Miller index (hkml) and in which 1 is greater than 0) on the Ga polarity side as a growth plane.

First, the free-standing substrate 30 of the present embodiment is formed of a group III nitride semiconductor crystal, and both the exposed first and second main surfaces in the relationship of top and bottom are semipolar planes.

As shown in the following example, even in a case where the thickness of the free-standing substrate 30 obtained from a portion having a growth thickness of 3 mm or more within the bulk crystal including the first growth layer 23 and the second growth layer 25 is 300 µm or more and 1000 µm or less, the difference between the half widths of the XRC measured by making X-rays incident on each of the first and second main surfaces in parallel to the m axis of the group III nitride semiconductor crystal can be 500 arcsec or less.

For both the first and second main surfaces, the half width of the XRC measured by making X-rays incident in parallel to the m axis shows a good numerical value of 500 arcsec or less.

In addition, as shown in the following example, even in a case where the thickness of the free-standing substrate 30 obtained from a portion having a growth thickness of 3 mm or more within the bulk crystal including the first growth layer 23 and the second growth layer 25 is 300 µm or more and 1000 µm or less, the difference between the half widths of the XRC measured by making X-rays incident on each of the first and second main surfaces in parallel to the projection axis of the c axis of the group III nitride semiconductor crystal can be 500 arcsec or less.

For both the first and second main surfaces, the half width of the XRC measured by making X-rays incident in parallel to the projection axis of the c axis shows a good numerical value of 500 arcsec or less.

Thus, in the free-standing substrate 30 of the present embodiment, both the "half width of the XRC measured by making X-rays incident in parallel to the projection axis of the c axis" and the "half width of the XRC measured by making X-rays incident in parallel to the m axis" show good numerical values.

As shown in the following example, in a case where the group III nitride semiconductor is grown to a thick film with the semipolar plane on the Ga polarity side as a growth plane, the half width of the XRC, which is one of the indices of crystallinity evaluation, becomes worse as the thickness of the growth increases. In particular, this tendency starts to appear noticeably in a portion having a growth thickness of 1 mm or more, and the crystallinity becomes significantly worse in a portion having a growth thickness of 3 mm or more, so that it becomes difficult to calculate the half width of the XRC. As one of the reasons, it can be considered that, in a case where the group III nitride semiconductor is grown with the semipolar plane on the Ga polarity side as a growth plane, the amount of unintended acquisition of oxygen atoms increases and accordingly the lattice constant of the crystal changes and dislocation defects increase.

As described above, the bulk crystal manufactured by the above characteristic manufacturing method has a large maximum diameter of 50 mm or more and 4 inches or less. The free-standing substrate 30 of the present embodiment obtained by being cut out from such a large-diameter bulk crystal also has a large maximum diameter of 50 mm or more and 4 inches or less.

EXAMPLES

<First Evaluation>

In the first evaluation, it is confirmed that the plane orientation of the growth plane of the group III nitride semiconductor layer can be set to the plane on the N polarity side by making all of the "plural factors for setting the plane orientation of the growth plane of the group III nitride semiconductor layer to the plane on the N polarity side" described above be satisfied. In addition, it is confirmed that the plane orientation of the growth plane of the group III nitride semiconductor layer is set to the plane on the Ga polarity side in a case where at least one of the "plural factors for setting the plane orientation of the growth plane of the group III nitride semiconductor layer to the plane on the N polarity side" is not satisfied.

First, a sapphire substrate was prepared in which the plane orientation of the main surface was a plane inclined by 2° from the m-plane ((10-10) plane) in a direction in which the m-plane becomes parallel to the a-plane. The thickness of the sapphire substrate was 430 µm, and the diameter was 2 inches.

Then, the heat treatment step S20 was performed on the prepared sapphire substrate under the following conditions.
Temperature: 1000 to 1050° C.
Pressure: 100 torr
Carrier gas: $H_2$, $N_2$
Heat treatment time: 10 minutes or 15 minutes
Carrier gas supply rate: 15 slm
In the heat treatment step S20, $NH_3$ of 20 slm was supplied to perform nitriding treatment.

Thereafter, the pre-flow step S30 was performed under the following conditions.
Temperature: 800 to 930° C.
Pressure: 100 torr
Trimethylaluminum supply rate, supply time: 90 sccm, 10 seconds
Carrier gas: $H_2$, $N_2$
Carrier gas supply rate: 15 slm
Thereafter, the buffer layer forming step S40 was performed under the following conditions to form an AlN layer.
Growth method: MOCVD method
Growth temperature: 800 to 930° C.
Pressure: 100 torr
Trimethylaluminum supply rate: 90 sccm
$NH_3$ supply rate: 5 slm
Carrier gas: $H_2$, $N_2$
Carrier gas supply rate: 15 slm
Thereafter, the first growth step S50 was performed under the following conditions to form a group III nitride semiconductor layer.
Growth method: MOCVD method
Pressure: 100 torr
TMGa supply rate: 50 to 500 sccm (continuous change)
$NH_3$ supply rate: 5 to 10 slm (continuous change)
Carrier gas: $H_2$, $N_2$
Carrier gas supply rate: 15 slm
Growth rate: 10 µm/h or higher
The growth temperature of a first sample was controlled to be 900° C.±25° C., and the growth temperature of a second sample was controlled to be 1050° C.±25° C. That is, the first sample is a sample satisfying all of the "plural factors for setting the plane orientation of the growth plane of the group III nitride semiconductor layer to the plane on the N polarity side" described above. The second sample is a sample that does not satisfy some (growth temperature in the first growth step S50 of the "plural factors for setting the plane orientation of the growth plane of the group III nitride semiconductor layer to the plane on the N polarity side" described above.

The plane orientation of the growth plane of the group III nitride semiconductor layer of the first sample was a plane inclined from the (−1-12-4) plane by 5.0° in the −a-plane direction and inclined by 8.5° or less in a direction in which the plane becomes parallel to the m-plane. On the other hand, the plane orientation of the growth plane of the group III nitride semiconductor layer of the second sample was a plane inclined from the (11-24) plane by 5.0° in the a-plane direction and 8.5° or less in a direction in which the plane becomes parallel to the m-plane. That is, it can be seen that it is possible to adjust whether the plane orientation of the growth plane is Ga polarity or N polarity depending on whether or not the "plural factors for setting the plane orientation of the growth plane of the group III nitride semiconductor layer to the plane on the N polarity side" described above are satisfied.

Figure 7:
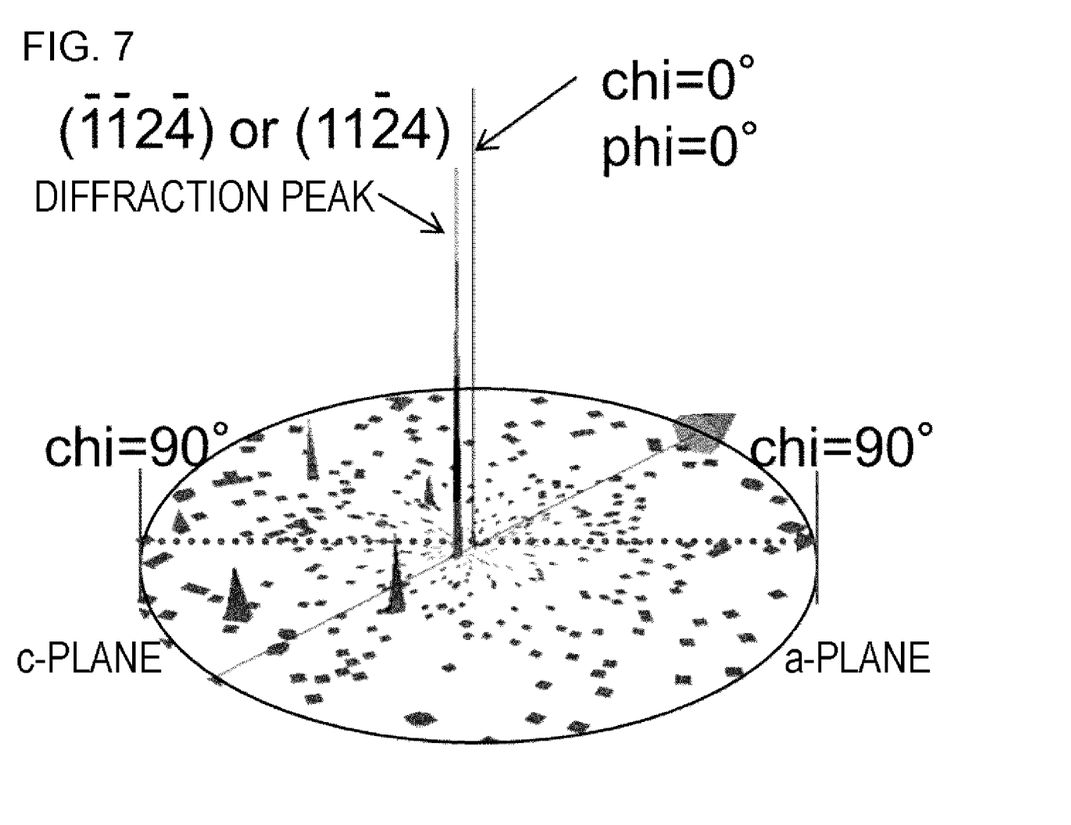
FIG. 7 is a diagram showing the characteristics of the free-standing substrate 10 and the template substrate 20 of the present embodiment.

FIG. 7 shows XRD pole point measurement results of the (−1-12-4) plane or the (11-24) plane in the first sample. It is possible to confirm that the diffraction peak is a position shifted by several degrees from the center point of the pole point. When the shift of the angle is measured in detail, it is possible to confirm that the peak is a position of 5.0° in the −a-plane direction and 8.5° in a direction in which the plane becomes parallel to the m-plane or a position of 5.0° in the a-plane direction and 8.5° in a direction in which the plane becomes parallel to the m-plane.

In addition, the present inventors have confirmed that, in a case where some of the other "plural factors for setting the plane orientation of the growth plane of the group III nitride semiconductor layer to the plane on the N polarity side" described above are not satisfied or in a case where nothing is satisfied, the plane orientation of the growth plane is Ga polarity.

<Second Evaluation>

In the second evaluation, it is confirmed that the plane orientation of the growth plane of the group III nitride semiconductor layer can be adjusted by adjusting the "plural factors for adjusting the plane orientation of the growth plane of the group III nitride semiconductor layer" described above.

First, plural sapphire substrates having various main surface orientations were prepared. The thickness of the sapphire substrate was 430 μm, and the diameter was 2 inches.

Then, the heat treatment step S20 was performed on each of the prepared sapphire substrates under the following conditions.

Temperature: 1000 to 1050° C.
Pressure: 200 torr
Growth time: 10 minutes
Carrier gas: $H_2$, $N_2$
Carrier gas supply rate: 15 slm In addition, samples were prepared by changing the presence or absence of nitriding treatment at the time of heat treatment. Specifically, both a sample for which $NH_3$ of 20 slm was supplied at the time of heat treatment and which was subjected to nitride treatment and a sample for which $NH_3$ was not supplied and which was not subjected to nitride treatment were prepared.

Thereafter, the pre-flow step S30 was performed under the following conditions.

Temperature: 880 to 930° C.
Pressure: 100 torr
Trimethylaluminum supply rate, supply time: 90 sccm, 10 seconds
Carrier gas: $H_2$, $N_2$
Carrier gas supply rate: 15 slm In addition, both a sample on which the pre-flow step S30 was performed and a sample on which the pre-flow step S30 was not performed were prepared.

Thereafter, a buffer layer (AlN buffer layer) having a thickness of about 150 nm was formed over the main surface (exposed surface) of the sapphire substrate under the following conditions.

Growth method: MOCVD method
Pressure: 100 torr
V/III ratio: 5184
TMAl supply rate: 90 ccm
$NH_3$ supply rate: 5 slm
Carrier gas: $H_2$, $N_2$
Carrier gas supply rate: 15 slm The growth temperature was changed in the range of 700° C. or higher and 1110° C. or lower for each sample.

Thereafter, a group III nitride semiconductor layer (GaN layer) having a thickness of about 15 μm was formed over the buffer layer under the following conditions.

Growth method: MOCVD method
Growth temperature: 900 to 1100° C.
Pressure: 100 torr
V/III ratio: 321
TMGa supply rate: 50 to 500 ccm (ramp up)
$NH_3$ supply rate: 5 to 10 slm (ramp up)
Carrier gas: $H_2$, $N_2$
Carrier gas supply rate: 15 slm As described above, a group III nitride semiconductor substrate 10 was manufactured in which the sapphire substrate, the buffer layer, and the group III nitride semiconductor layer were laminated in this order.

Tables 1 to 7 show the relationship between the "plural factors for adjusting the plane orientation of the growth plane of the group III nitride semiconductor layer" and the plane orientation of the growth plane of the group III nitride semiconductor layer.

TABLE 1

| | | Sapphire main surface | Presence or absence of nitriding treatment at time of temperature rising | Presence or absence of trimethylaluminum pre-flow step | AlN buffer growth temperature (° C.) | GaN growth temperature (° C.) | Growth plane of group III nitride semiconductor layer |
|---|---|---|---|---|---|---|---|
| First evaluation | First sample | Plane inclined by 2° from m-plane (10-10) in direction in which the plane becomes parallel to a-plane | With nitriding treatment | With pre-flow | 925 ± 25 | 950 ± 25 | Inclined from (-1-12-4) plane by 5.0° in -a-plane direction and inclined by 8.5° in direction in which the plane becomes parallel to m-plane |
| | Second sample | | | | | 1050 ± 25 | Inclined from (11-24) plane by 5.0° in a-plane direction and inclined by 8.5° in direction in which the plane becomes parallel to m-plane |

TABLE 2

| | | Sapphire main surface | Presence or absence of nitriding treatment at time of temperature rising | Presence or absence of trimethylaluminum pre-flow step | AlN buffer growth temperature (° C.) | GaN growth temperature (° C.) | Growth plane of group III nitride semiconductor layer |
|---|---|---|---|---|---|---|---|
| Second evaluation | | m-plane (10-10) or plane inclined by 0.5° in any direction from m-plane (10-10) | With nitriding treatment | With pre-flow | 925 ± 25 | 950 ± 25 | Inclined from (-1-12-4) plane by 4.0° in -a-plane direction and inclined by 7.5° in direction in which the plane becomes parallel to m-plane |
| | | | With nitriding treatment | With pre-flow | 925 ± 25 | 1075 ± 25 | Inclined from (11-24) plane by 4.0° in a-plane direction and inclined by 7.5° in direction in which the plane becomes parallel to m-plane |

TABLE 2-continued

| | Sapphire main surface | Presence or absence of nitriding treatment at time of temperature rising | Presence or absence of trimethylaluminum pre-flow step | AlN buffer growth temperature (° C.) | GaN growth temperature (° C.) | Growth plane of group III nitride semiconductor layer |
|---|---|---|---|---|---|---|
| | | With nitriding treatment | With pre-flow | 1085 ± 25 | 950 ± 25 | Inclined by 0.5° in any direction from (11-22) plane |
| | | With nitriding treatment | With pre-flow | 725 ± 25 | 950 ± 25 | Inclined by 0.5° in any direction from (11-22) plane |
| | | With nitriding treatment | With pre-flow | 1085 ± 25 | 1075 ± 25 | Inclined by 0.5° in any direction from (11-22) plane |
| | | With nitriding treatment | No pre-flow | 1085 ± 25 | 1075 ± 25 | Inclined by 0.5° in any direction from (11-22) plane |
| | | With nitriding treatment | No pre-flow | 925 ± 25 | 950 ± 25 | Inclined from (11-24) plane by 4.0° in a-plane direction and inclined by 7.5° in direction in which the plane becomes parallel to m-plane |
| | | No nitriding treatment | With pre-flow | 925 ± 25 | 950 ± 25 | Inclined by 0.5° in any direction from (10-10) plane |

TABLE 3

| | Sapphire main surface | Presence or absence of nitriding treatment at time of temperature rising | Presence or absence of trimethylaluminum pre-flow step | AlN buffer growth temperature (° C.) | GaN growth temperature (° C.) | Growth plane of group III nitride semiconductor layer |
|---|---|---|---|---|---|---|
| Second evaluation | Plane inclined by 0.5° or more and 1.5° or less from m-plane (10-10) in direction in which the plane becomes parallel to a-plane | With nitriding treatment | With pre-flow | 950 ± 25 | 975 ± 25 | Inclined from (-1-12-4) plane by 4.4° in -a-plane direction and inclined by 7.9° in direction in which the plane becomes parallel to m-plane |
| | | With nitriding treatment | With pre-flow | 950 ± 25 | 1070 ± 25 | Inclined from (11-24) plane by 4.4° in a-plane direction and inclined by 7.9° in direction in which the plane becomes parallel to m-plane |
| | | With nitriding treatment | With pre-flow | 1075 ± 25 | 975 ± 25 | Inclined by 1.0° in direction from (11-22) plane to m-plane |
| | | With nitriding treatment | With pre-flow | 750 ± 25 | 975 ± 25 | Inclined by 1.0° in direction from (11-22) plane to m-plane |
| | | With nitriding treatment | With pre-flow | 1075 ± 25 | 1070 ± 25 | Inclined by 1.0° in direction from (11-22) plane to m-plane |
| | | With nitriding treatment | No pre-flow | 1075 ± 25 | 1070 ± 25 | Inclined by 1.0° in direction from (11-22) plane to m-plane |
| | | With nitriding treatment | No pre-flow | 950 ± 25 | 975 ± 25 | Inclined from (11-24) plane by 4.4° in a-plane direction and inclined by 7.9° in direction in which the plane becomes parallel to m-plane |
| | | No nitriding treatment | With pre-flow | 950 ± 25 | 975 ± 25 | (20-27) plane |

TABLE 4

| | Sapphire main surface | Presence or absence of nitriding treatment at time of temperature rising | Presence or absence of trimethylaluminum pre-flow step | AlN buffer growth temperature (° C.) | GaN growth temperature (° C.) | Growth plane of group III nitride semiconductor layer |
|---|---|---|---|---|---|---|
| Second evaluation | Plane inclined by 1.5° or more and 2.5° or | With nitriding treatment | With pre-flow | 925 ± 25 | 950 ± 25 | Inclined from (-1-12-4) plane by 5.0° in -a-plane direction and inclined by 8.5° in direction in which the plane becomes parallel to m-plane |

TABLE 4-continued

| | Sapphire main surface | Presence or absence of nitriding treatment at time of temperature rising | Presence or absence of trimethylaluminum pre-flow step | AlN buffer growth temperature (° C.) | GaN growth temperature (° C.) | Growth plane of group III nitride semiconductor layer |
|---|---|---|---|---|---|---|
| | less from m-plane (10-10) in direction in which the plane becomes parallel to a-plane | With nitriding treatment | With pre-flow | 925 ± 25 | 1070 ± 25 | Inclined from (11-24) plane by 5.0° in a-plane direction and inclined by 8.5° in direction in which the plane becomes parallel to m-plane |
| | | With nitriding treatment | With pre-flow | 1080 ± 25 | 950 ± 25 | Inclined by 2.0° in direction from (11-22) plane to m-plane |
| | | With nitriding treatment | With pre-flow | 750 ± 25 | 950 ± 25 | Inclined by 2.0° in direction from (11-22) plane to m-plane |
| | | With nitriding treatment | With pre-flow | 1080 ± 25 | 1070 ± 25 | Inclined by 2.0° in direction from (11-22) plane to m-plane |
| | | With nitriding treatment | No pre-flow | 1080 ± 25 | 1070 ± 25 | Inclined by 2.0° in direction from (11-22) plane to m-plane |
| | | With nitriding treatment | No pre-flow | 925 ± 25 | 950 ± 25 | Inclined from (11-24) plane by 5.0° in a-plane direction and inclined by 8.5° in direction in which the plane becomes parallel to m-plane |
| | | No nitriding treatment | With pre-flow | 925 ± 25 | 950 ± 25 | (20-27) plane |

TABLE 5

| | Sapphire main surface | Presence or absence of nitriding treatment at time of temperature rising | Presence or absence of trimethylaluminum pre-flow step | AlN buffer growth temperature (° C.) | GaN growth temperature (° C.) | Growth plane of group III nitride semiconductor layer |
|---|---|---|---|---|---|---|
| Second evaluation | Plane inclined by 4.5° or more and 5.5° or less from m-plane (10-10) in direction in which the plane becomes parallel to a-plane | With nitriding treatment | With pre-flow | 950 ± 25 | 975 ± 25 | Inclined from (-1-12-4) plane by 6.9° in -a-plane direction and inclined by 11.6° in direction in which the plane becomes parallel to m-plane |
| | | With nitriding treatment | With pre-flow | 950 ± 25 | 1075 ± 25 | Inclined from (11-24) plane by 6.9° in a-plane direction and inclined by 11.6° in direction in which the plane becomes parallel to m-plane |
| | | With nitriding treatment | With pre-flow | 1075 ± 25 | 975 ± 25 | Inclined by 5.0° in direction from (11-22) plane to m-plane |
| | | With nitriding treatment | With pre-flow | 750 ± 25 | 975 ± 25 | Inclined by 5.0° in direction from (1122) plane to m-plane |
| | | With nitriding treatment | With pre-flow | 1075 ± 25 | 1075 ± 25 | Inclined by 5.0° in direction from (11-22) plane to m-plane |
| | | With nitriding treatment | No pre-flow | 1075 ± 25 | 1075 ± 25 | Inclined by 5.0° in direction from (11-22) plane to m-plane |
| | | With nitriding treatment | No pre-flow | 950 ± 25 | 975 ± 25 | Inclined from (11-24) plane by 6.9° in a-plane direction and inclined by 11.6° in direction in which the plane becomes parallel to m-plane |
| | | No nitriding treatment | With pre-flow | 950 ± 25 | 975 ± 25 | Inclined by 5.0° in direction from (11-22) plane to m-plane |

TABLE 6

| | Sapphire main surface | Presence or absence of nitriding treatment at time of temperature rising | Presence or absence of trimethylaluminum pre-flow step | AlN buffer growth temperature (° C.) | GaN growth temperature (° C.) | Growth plane of group III nitride semiconductor layer |
|---|---|---|---|---|---|---|
| Second evaluation | Plane inclined by 6.5° or more and 7.5° or | With nitriding treatment | With pre-flow | 925 ± 25 | 950 ± 25 | Inclined from (-1-12-4) plane by 8.4° in -a-plane direction and inclined by 12.2° in direction in which the plane becomes parallel to m-plane |

TABLE 6-continued

| Sapphire main surface | Presence or absence of nitriding treatment at time of temperature rising | Presence or absence of trimethylaluminum pre-flow step | AlN buffer growth temperature (° C.) | GaN growth temperature (° C.) | Growth plane of group III nitride semiconductor layer |
|---|---|---|---|---|---|
| less from m-plane (10-10) in direction in which the plane becomes parallel to a-plane | With nitriding treatment | With pre-flow | 925 ± 25 | 1070 ± 25 | Inclined from (11-24) plane by 8.4° in a-plane direction and inclined by 12.2° in direction in which the plane becomes parallel to m-plane |
| | With nitriding treatment | With pre-flow | 1080 ± 25 | 950 ± 25 | Inclined by 7.0° in direction from (11-22) plane to m-plane |
| | With nitriding treatment | With pre-flow | 750 ± 25 | 950 ± 25 | Inclined by 7.0° in direction from (11-22) plane to m-plane |
| | With nitriding treatment | With pre-flow | 1080 ± 25 | 1070 ± 25 | Inclined by 7.0° in direction from (11-22) plane to m-plane |
| | With nitriding treatment | No pre-flow | 1080 ± 25 | 1070 ± 25 | Inclined by 7.0° in direction from (11-22) plane to m-plane |
| | With nitriding treatment | No pre-flow | 925 ± 25 | 950 ± 25 | Inclined from (11-24) plane by 8.4° in a-plane direction and inclined by 12.2° in direction in which the plane becomes parallel to m-plane |
| | No nitriding treatment | With pre-flow | 925 ± 25 | 950 ± 25 | (10-13) plane |

TABLE 7

| | Sapphire main surface | Presence or absence of nitriding treatment at time of temperature rising | Presence or absence of trimethylaluminum pre-flow step | AlN buffer growth temperature (° C.) | GaN growth temperature (° C.) | Growth plane of group III nitride semiconductor layer |
|---|---|---|---|---|---|---|
| Second evaluation | Plane inclined by 9.5° or more and 10.5° or less from m-plane (10-10) in direction in which the plane becomes parallel to a-plane | With nitriding treatment | With pre-flow | 925 ± 25 | 975 ± 25 | Inclined from (-1-12-4) plane by 10.4° in -a-plane direction and inclined by 14.8° in direction in which the plane becomes parallel to m-plane |
| | | With nitriding treatment | With pre-flow | 925 ± 25 | 1070 ± 25 | Inclined from (11-24) plane by 10.4° in a-plane direction and inclined by 14.8° in direction in which the plane becomes parallel to m-plane |
| | | With nitriding treatment | With pre-flow | 1080 ± 25 | 975 ± 25 | Inclined by 10.0° in direction from (11-22) plane to m-plane |
| | | With nitriding treatment | With pre-flow | 750 ± 25 | 975 ± 25 | Inclined by 10.0° in direction from (11-22) plane to m-plane |
| | | With nitriding treatment | With pre-flow | 1080 ± 25 | 1070 ± 25 | Inclined by 10.0° in direction from (11-22) plane to m-plane |
| | | With nitriding treatment | No pre-flow | 1080 ± 25 | 1070 ± 25 | Inclined by 10.0° in direction from (11-22) plane to m-plane |
| | | With nitriding treatment | No pre-flow | 925 ± 25 | 975 ± 25 | Inclined from (11-24) plane by 10.4° in a-plane direction and inclined by 14.8° in direction in which the plane becomes parallel to m-plane |
| | | No nitriding treatment | With pre-flow | 925 ± 25 | 975 ± 25 | (10-15) plane |

The column of "Sapphire main surface" in the Tables shows the plane orientation of the main surface of the sapphire substrate. The column of "Nitriding treatment at the time of temperature rising" shows the presence or absence ("present" or "absent") of nitriding treatment at the time of temperature rising during the heat treatment step S20. The column "Presence or absence of trimethylaluminum pre-flow step" shows the presence or absence ("present" or "absent") of the trimethylaluminum pre-flow step. The column of "AlN buffer growth temperature" shows the growth temperature in the buffer layer forming step. The column of "GaN growth temperature" shows the growth temperature in the GaN layer forming step. The column of "Growth plane of group III-nitride semiconductor layer" shows the plane orientation of the growth plane of the group III-nitride semiconductor layer.

According to the results, it can be seen that the plane orientation of the growth plane of the group III nitride semiconductor layer can be adjusted to semipolar and Ga polarity by adjusting the "plural factors for adjusting the plane orientation of the growth plane of the group III nitride semiconductor layer" described above. Then, according to the result of the first evaluation and the result of the second evaluation, in a case where all of the "plural factors for setting the plane orientation of the growth plane of the group III nitride semiconductor layer to the N polarity side" are satisfied, the plane orientation of the growth plane of the group III nitride semiconductor layer can be adjusted to semipolar and N polarity by adjusting the "plural factors for adjusting the plane orientation of the growth plane of the group III nitride semiconductor layer".

<Third Evaluation>

In the third evaluation, the crystallinity of the free-standing substrate 30 is evaluated with the half width of the XRC.

Example 1

First, a GaN layer (first growth layer 23) was formed over an m-plane sapphire substrate having an off angle of 2° in the a-plane direction with a buffer layer interposed therebetween using the MOCVD method. The main surface (exposed surface) of the first growth layer 23 was a semipolar plane ({-1-12-4} plane (off angle+α°)) on the N polarity side. The thickness of the first growth layer 23 was about 15 μm.

Thereafter, a GaN crystal was grown over the first growth layer 23 using the HVPE method to form a GaN layer (second growth layer 25) having a thickness of about 11 mm. Thereafter, a portion having a growth thickness of 3 mm or more in the bulk crystal formed of the first growth layer 23 and the second growth layer 25 was sliced perpendicularly to the growth direction to obtain plural semipolar substrates.

Then, GaN (11-22) plane diffraction XRC measurement was performed on each of the substrates. The measurement was performed with two patterns, one in which X-rays were incident parallel to the m axis and the other in which X-rays were incident parallel to the projection axis of the c axis.

Figure 8:
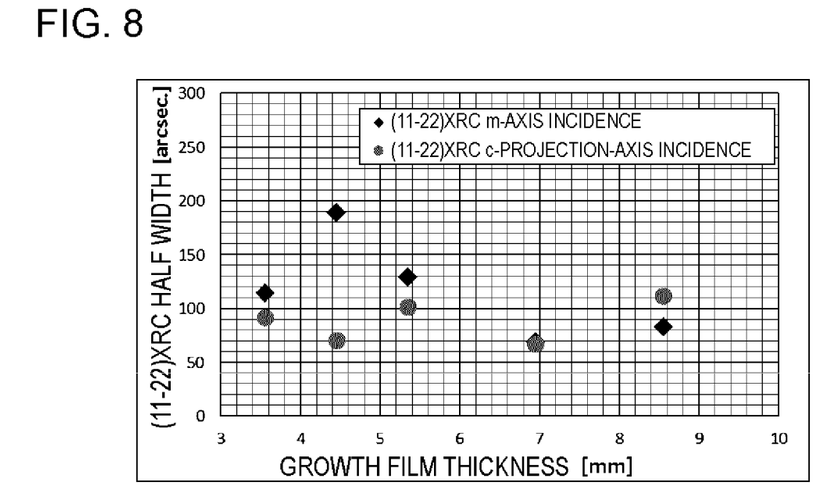
FIG. 8 is a diagram showing the characteristics of the free-standing substrate 30 of the present embodiment.

FIG. 8 shows the result of GaN (11-22) plane diffraction XRC measurement. The horizontal axis in the diagram indicates the growth film thickness (cutting position from the bulk crystal of the semipolar substrate obtained by slicing). The vertical axis in the diagram indicates the GaN (11-22) XRC half width.

In Example 1, it can be seen that both the half width of the XRC measured by making X-rays incident in parallel to the m axis and the half width of the XRC measured by making X-rays incident in parallel to the projection axis of the c axis tend to hardly change or become gradually better as the growth film thickness increases.

Then, it can be seen that, in the growth film thickness range of 3000 μm to 10000 μm, the half width of the XRC measured by making X-rays incident in parallel to the m axis can be 500 arcsec or less, preferably 300 arcsec or less, more preferably 250 arcsec or less. Similarly, it can be seen that, in the same range, the half width of the XRC measured by making X-rays incident in parallel to the projection axis of the c axis can be 500 arcsec or less, preferably 300 arcsec or less, more preferably 200 arcsec or less, more preferably 150 arcsec or less.

As can be seen from the diagram, in a semipolar substrate having a thickness of 300 μm or more and 1000 μm or less obtained by slicing a portion having a growth thickness of 3 mm or more within the bulk crystal perpendicularly to the growth direction, the difference between the half widths of the XRC measured by making X-rays incident on each of the first and second main surfaces (top and bottom surfaces) in parallel to the m axis of the group III nitride semiconductor crystal is 500 arcsec or less, preferably 300 arcsec or less, more preferably 250 arcsec or less, and more preferably 150 arcsec or less.

In addition, as can be seen from the diagram, in a semipolar substrate having a thickness of 300 μm or more and 1000 μm or less obtained by slicing a portion having a growth thickness of 3 mm or more within the bulk crystal perpendicularly to the growth direction, the difference between the half widths of the XRC measured by making X-rays incident on each of the first and second main surfaces (top and bottom surfaces) in parallel to the projection axis of the c axis of the group III nitride semiconductor crystal is 500 arcsec or less, preferably 300 arcsec or less, more preferably 200 arcsec or less, more preferably 150 arcsec or less, more preferably 100 arcsec or less.

In addition, it can be seen that both the difference between the half widths of the XRC measured by making X-rays incident on each of the first and second main surfaces (top and bottom surfaces) in parallel to the m axis of the group III nitride semiconductor crystal and the difference between the half widths of the XRC measured by making X-rays incident on each of the first and second main surfaces (top and bottom surfaces) in parallel to the projection axis of the c axis become 200 arcsec or less by setting the thickness to 300 μm or more and 500 μm or less.

Comparative Example 1

Using the MOCVD method, a GaN layer was formed over the just m plane sapphire substrate with a buffer layer interposed therebetween. The main surface (exposed surface) of the GaN layer was a semipolar plane ((11-22) plane) on the Ga polarity side. The thickness of the GaN layer was about 1 μm.

Then, a GaN layer having a thickness of about 15 μm was formed over the GaN layer using the HVPE method. At this time, the half width of the GaN (11-22) XRC measured by making X-rays incident in parallel to the maxis of the group III nitride semiconductor crystal was 955 arcsec. In addition, the half width of the GaN (11-22) XRC measured by making X-rays incident in parallel to the projection axis of the c axis of the group III nitride semiconductor crystal was 461 arcsec.

In addition, a GaN layer having a thickness of about 1.5 μm was formed over the GaN layer. Thereafter, the bulk crystal formed of the GaN layer obtained by the MOCVD method and the HVPE method was ground and polished to obtain a semipolar substrate.

Figure 9:
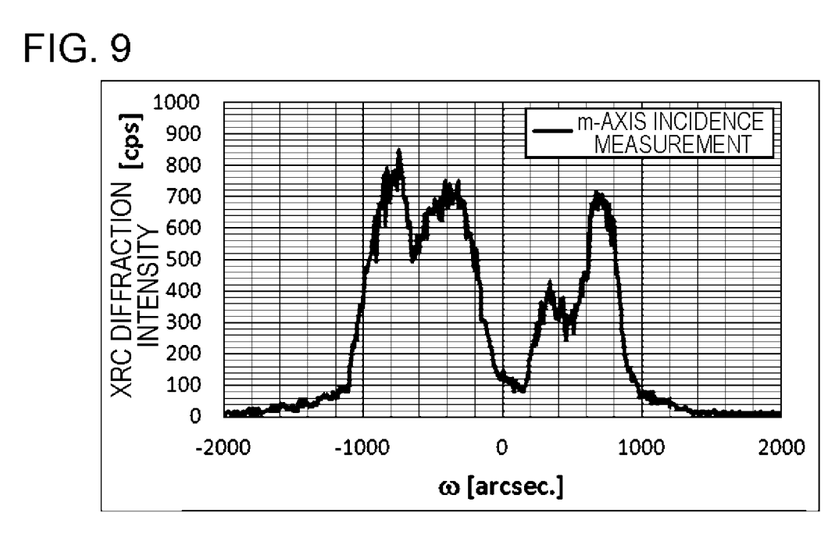
FIG. 9 is a diagram showing the characteristics of a substrate of a comparative example.
Figure 10:
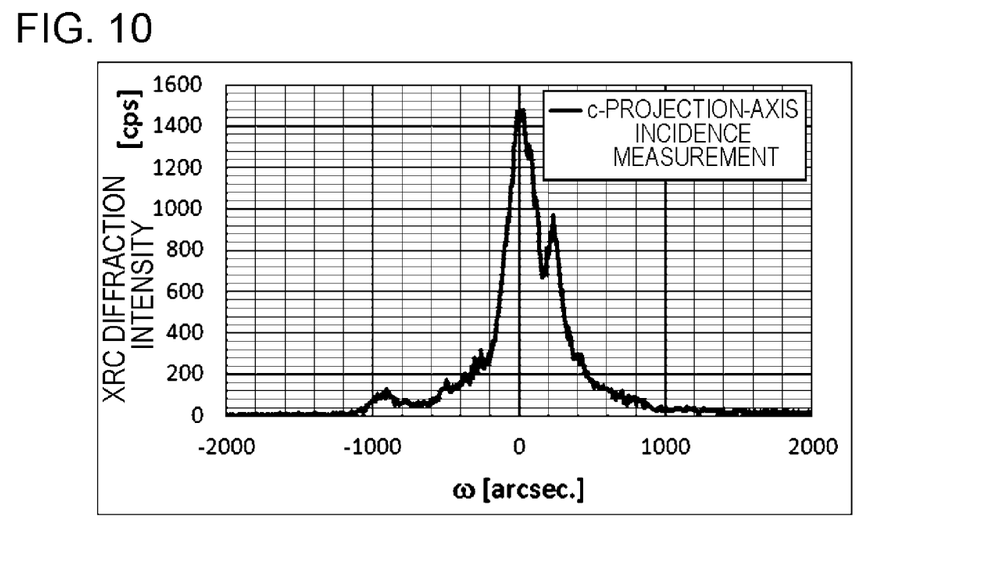
FIG. 10 is a diagram showing the characteristics of a substrate of a comparative example.

Here, FIG. 9 shows a measurement result of the GaN (11-22) XRC measured by making X-rays incident in parallel to the m axis of the group III nitride semiconductor crystal in the semipolar substrate of Comparative Example 1. FIG. 10 shows a measurement result of the GaN (11-22) XRC measured by making X-rays incident in parallel to the projection axis of the c axis of the group III nitride semiconductor crystal in the semipolar substrate of Comparative Example 1. As shown in these diagrams, all the crystal axes are oriented in various directions and are multi-peaked. That is, in crystal growth of the (11-22) plane GaN layer, it can be seen that the orientation of the crystal tends to be broken as the film thickness of the GaN layer increases. For a substrate cut out from such crystal, the difference in XRC half width between the first and second main surfaces cannot be defined, but it can be seen that the difference is larger than that in Example 1.

<Fourth Evaluation>

Next, it is confirmed that the free-standing substrate 30 having a semipolar plane as a main surface and a large maximum diameter of 50 mm or more and 4 inches or less can be obtained by the manufacturing method of the present embodiment.

First, the template substrate 20 was prepared in which a GaN layer (first growth layer 23) was formed over the sapphire substrate 21, which had a diameter of φ4 inches and in which the plane orientation of the main surface was an m plane, with the buffer layer 22 interposed therebetween using the MOCVD. The plane orientation of the main surface of the first growth layer 23 was (−1-12-3), and the maximum diameter was φ4 inches.

Then, the template substrate 20 was fixed to a carbon susceptor. Specifically, the bottom surface of the sapphire substrate 21 was bonded to the main surface of the carbon susceptor using an alumina based adhesive.

Then, in a state in which the template substrate 20 was fixed to the carbon susceptor, group III nitride semiconductor (GaN) was grown over the main surface of the first growth layer 23 using the HVPE method. As a result, a GaN layer (a part of the second growth layer 25) formed of a single crystal group III nitride semiconductor was formed. The growth conditions are as follows.

Growth temperature: 1040° C.
Growth time: 15 hours
V/III ratio: 10
Growth film thickness: 4.4 mm Then, a laminate including the carbon susceptor, the template substrate 20, and a part of the second growth layer 25 was taken out from the HVPE apparatus and cooled to the room temperature. The laminate after cooling was observed, and cracks were present on the surface. In addition, polycrystalline group III nitride semiconductors were attached along the outer periphery of the laminate, these were connected to each other to form an annular shape, and the laminate was held thereinside.

Then, in a state in which the polycrystalline group III nitride semiconductor remained, group III nitride semiconductor (GaN) was grown over the main surface of the GaN layer (a part of the second growth layer 25) with a crack using the HVPE method. As a result, a GaN layer (another part of the second growth layer 25) formed of a single crystal group III nitride semiconductor was formed. The growth conditions are as follows.

Growth temperature: 1040° C.
Growth time: 14 hours
V/III ratio: 10
Growth film thickness: 3.0 mm (film thickness of the second growth layer 25 is 7.4 mm)

The maximum diameter of the second growth layer 25 was about φ4 inches. In addition, the maximum diameter of a surface including the second growth layer 25 and the polycrystalline group III nitride semiconductor along the outer periphery thereof was about 130 mm. In addition, cracking did not occur in the second growth layer 25.

Then, the second growth layer 25 was sliced to obtain plural free-standing substrates 30. Cracking did not occur in the free-standing substrate 30, and the maximum diameter was about φ4 inches.

Hereinafter, examples of reference forms are additionally described.

1. A group III nitride semiconductor substrate that is formed of a group III nitride semiconductor crystal and has a thickness of 300 μm or more and 1000 μm or less, in which both exposed first and second main surfaces in a relationship of top and bottom are semipolar planes, and a difference between half widths of an XRC measured by making X-rays incident on each of the first and second main surfaces in parallel to an m axis of the group III nitride semiconductor crystal is 500 arcsec or less.

2. The group III nitride semiconductor substrate according to 1, in which the difference between the half widths of the XRC measured by making X-rays incident on each of the first and second main surfaces in parallel to the m axis of the group III nitride semiconductor crystal is 300 arcsec or less.

3. The group III nitride semiconductor substrate according to 1 or 2, in which for both the first and second main surfaces, the half width of the XRC measured by making X-rays incident in parallel to the m axis of the group III nitride semiconductor crystal is 500 arcsec or less.

4. The group III nitride semiconductor substrate according to any one of 1 to 3, in which the difference between the half widths of the XRC measured by making X-rays incident on each of the first and second main surfaces in parallel to a projection axis of a c axis of the group III nitride semiconductor crystal is 500 arcsec or less.

5. The group III nitride semiconductor substrate according to 4, in which the difference between the half widths of the XRC measured by making X-rays incident on each of the first and second main surfaces in parallel to the projection axis of the c axis of the group III nitride semiconductor crystal is 300 arcsec or less.

6. The group III nitride semiconductor substrate according to 4 or 5, in which for both the first and second main surfaces, the half width of the XRC measured by making X-rays incident in parallel to the projection axis of the c axis of the group III nitride semiconductor crystal is 500 arcsec or less.

7. A method of manufacturing a group III nitride semiconductor substrate including: a substrate preparation step of preparing a sapphire substrate; a heat treatment step of performing heat treatment on the sapphire substrate after the substrate preparation step; a pre-flow step of supplying a metal-containing gas onto the sapphire substrate after the heat treatment step; a buffer layer forming step of forming a buffer layer over the sapphire substrate under growth conditions of a growth temperature of 800° C. or higher and 950° C. or lower and a pressure of 30 torr or higher and 200 torr or lower after the pre-flow step; a first growth step of forming a first growth layer by growing a group III nitride semiconductor over the buffer layer under growth conditions of a growth temperature of 800° C. or higher and 1025° C. or lower, a pressure of 30 torr or higher and 200 torr or lower, and a growth rate of 10 μm/h or higher using an MOCVD method after the buffer layer forming step; and a second growth step of forming a second growth layer by growing a group III nitride semiconductor over the first growth layer using an HVPE method after the first growth step.

8. The method of manufacturing a group III nitride semiconductor substrate according to 7 further including: a cutting step of cutting the group III nitride semiconductor substrate from a bulk crystal including the first growth layer and the second growth layer.

9. The method of manufacturing a group III nitride semiconductor substrate according to 8, in which, in the cutting step, the group III nitride semiconductor substrate is cut out from a portion having a growth thickness of 3 mm or more within the bulk crystal.

This application claims priority based on Japanese Patent Application No. 2017-064486 filed on Mar. 29, 2017, the entire disclosure of which is incorporated herein.

The invention claimed is:

1. A group III nitride semiconductor substrate that is formed of a group III nitride semiconductor crystal and has a thickness of 300 μm or more and 1000 μm or less, wherein both exposed first and second main surfaces in a relationship of top and bottom are semipolar planes, and a difference between a half width of an X-ray rocking curve (XRC) measured by making X-rays incident on the first main surface in parallel to an m axis of the group III nitride semiconductor crystal and a half width of an X-ray rocking curve (XRC) measured by making X-rays incident on the second main surface in parallel to the m axis of the group III nitride semiconductor crystal is 500 arcsec or less.

2. The group III nitride semiconductor substrate according to claim 1,
wherein the difference between the half width of the XRC measured by making X-rays incident on the first main surface in parallel to the m axis of the group III nitride semiconductor crystal and the half width of the X-ray rocking curve (XRC) measured by making X-rays incident on the second main surface in parallel to the m axis of the group III nitride semiconductor crystal is 300 arcsec or less.

3. The group III nitride semiconductor substrate according to claim 1,
wherein for both the first and second main surfaces, the half width of the XRC measured by making X-rays incident in parallel to the m axis of the group III nitride semiconductor crystal is 500 arcsec or less.

4. The group III nitride semiconductor substrate according to claim 1,
wherein the difference between the half width of the XRC measured by making X-rays incident on the first main surface in parallel to a projection axis of a c axis of the group III nitride semiconductor crystal and the half width of the XRC measured by making X-rays incident on the second main surface in parallel to the projection axis of the c axis of the group III nitride semiconductor crystal is 500 arcsec or less.

5. The group III nitride semiconductor substrate according to claim 4,
wherein the difference between the half width of the XRC measured by making X-rays incident on the first main surface in parallel to the projection axis of the c axis of the group III nitride semiconductor crystal and the half width of the XRC measured by making X-rays incident on the second main surface in parallel to the projection axis of the c axis of the group III nitride semiconductor crystal is 300 arcsec or less.

6. The group III nitride semiconductor substrate according to claim 4,
wherein for both the first and second main surfaces, the half width of the XRC measured by making X-rays incident in parallel to the projection axis of the c axis of the group III nitride semiconductor crystal is 500 arcsec or less.

7. A method of manufacturing the group III nitride semiconductor substrate of claim 1, comprising:
a substrate preparation step of preparing a sapphire substrate;
a heat treatment step of performing heat treatment on the sapphire substrate after the substrate preparation step;
a pre-flow step of supplying a metal-containing gas onto the sapphire substrate after the heat treatment step;
a buffer layer forming step of forming a buffer layer over the sapphire substrate under growth conditions of a growth temperature of 800° C. or higher and 950° C. or lower and a pressure of 30 torr or higher and 200 torr or lower after the pre-flow step;
a first growth step of forming a first growth layer by growing a group III nitride semiconductor over the buffer layer under growth conditions of a growth temperature of 800° C. or higher and 1025° C. or lower, a pressure of 30 torr or higher and 200 torr or lower, and a growth rate of 10 μm/h or higher using a metal organic chemical vapor deposition (MOCVD) method after the buffer layer forming step; and
a second growth step of forming a second growth layer by growing a group III nitride semiconductor over the first growth layer using an HVPE method after the first growth step.

8. The method of manufacturing a group III nitride semiconductor substrate according to claim 7, further comprising:
a cutting step of cutting the group III nitride semiconductor substrate from a bulk crystal including the first growth layer and the second growth layer.

9. The method of manufacturing a group III nitride semiconductor substrate according to claim 8,
wherein, in the cutting step, the group III nitride semiconductor substrate is cut out from a portion having a growth thickness of 3 mm or more within the bulk crystal.

* * * * *